United States Patent
Ghosh et al.

(10) Patent No.: US 7,304,428 B2
(45) Date of Patent: Dec. 4, 2007

(54) MULTILAYERED CATHODE STRUCTURES HAVING SILVER FOR OLED DEVICES

(75) Inventors: Amalkumar P. Ghosh, Rochester, NY (US); Steven A. Van Slyke, Pittsford, NY (US); Angelo G. Pignata, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 442 days.

(21) Appl. No.: 11/011,857

(22) Filed: Dec. 14, 2004

(65) Prior Publication Data

US 2006/0125376 A1  Jun. 15, 2006

(51) Int. Cl.
*H01J 1/62* (2006.01)
*H01J 63/04* (2006.01)
(52) U.S. Cl. ....................... 313/506; 313/509
(58) Field of Classification Search ............... 313/506
See application file for complete search history.

(56) References Cited

U.S. PATENT DOCUMENTS

| | | |
|---|---|---|
| 4,356,429 A | 10/1982 | Tang |
| 4,769,292 A | 9/1988 | Tang et al. |
| 4,885,211 A | 12/1989 | Tang et al. |
| 5,550,066 A | 8/1996 | Tang et al. |
| 2005/0127824 A1* | 6/2005 | Mori et al. ............ 313/504 |
| 2005/0282068 A1* | 12/2005 | Liu et al. ............... 429/128 |

* cited by examiner

*Primary Examiner*—Joseph Williams
*Assistant Examiner*—Bumsuk Won
(74) *Attorney, Agent, or Firm*—Raymond L. Owens

(57) ABSTRACT

A cathode structure for use in an OLED device having one or more OLED layers includes a thin light-transmissive layer having a top surface and a bottom surface and including silver (Ag) wherein the Ag acts as a conductor for the cathode structure, and a light-transmissive electron-injecting layer disposed in contact with the bottom surface of the thin light-transmissive layer and with an underlying OLED layer. The structure also includes an oxide layer disposed over the thin light-transmissive layer, and a separation layer disposed between the top surface of the thin light-transmissive layer and the oxide layer.

12 Claims, 2 Drawing Sheets

EXAMPLE 1

EXAMPLE 2

MULTILAYERED CATHODE STRUCTURES HAVING SILVER FOR OLED DEVICES

FIELD OF THE INVENTION

The present invention relates to cathode structures for OLED devices.

BACKGROUND OF THE INVENTION

Full color organic electroluminescent (EL), also known as organic light-emitting devices (OLED), have been demonstrated recently as a new type of flat panel display. OLED devices are attractive because of their low driving voltage, high luminance, wide-angle viewing, and capability for full color flat emission displays. In simplest form, an organic EL device is comprised of an anode for hole injection, a cathode for electron injection, and an organic EL medium sandwiched between these electrodes to support charge recombination that yields emission of light. An example of an organic EL device is described in commonly assigned U.S. Pat. No. 4,356,429. Other examples have been described by Tang et al. in U.S. Pat. Nos. 4,769,292, 4,885,211, and 5,550,066. However, in a bottom-emitting type of display where light is emitted downward through the substrate, the overall area that can emit light is limited by the presence on the substrate of thin film transistors (TFT's) and other circuitry, which are opaque. In contrast, top-emitting device structures have significantly higher emission areas than bottom-emitting devices.

Therefore, much work has been done to produce OLED devices, which are top- or surface-emitting. This configuration has the potential to improve display performance compared with bottom-emitting OLEDs by: 1) increasing the aperture ratio, therefore allowing the pixel to operate at a lower current density with improved stability; 2) allowing more complex drive circuitry to enable better control of pixel current, leading to enhanced display performance (uniformity, stability); 3) enabling lower mobility materials, e.g., amorphous silicon, to be considered for TFT fabrication; and 4) allowing schemes for increasing the emission out coupling (increased efficiency) that are not available for the bottom-emitting format. Current designs for top-emitting OLEDs often utilize a reflective metallic anode as the bottom electrode and a semi-reflective metallic cathode as the top electrode. These metallic materials contribute to a microcavity effect within the devices, which can be useful for certain applications. Highly transparent materials, e.g., indium-tin-oxide (ITO), can replace the semi-reflective cathodes; however, these materials are less electrically conductive.

There is a continuing need for improved cathode structures.

SUMMARY OF THE INVENTION

It is therefore an object of the present invention to provide a cathode structure for a top-emitting OLED device with improved performance.

This object is achieved by a cathode structure for use in an OLED device, comprising:

a) a thin light-transmissive layer having a top surface and a bottom surface and including silver (Ag) wherein the Ag acts as a conductor for the cathode structure;

b) a light-transmissive electron-injecting layer disposed in contact with the bottom surface of the thin light-transmissive layer and with an underlying OLED layer;

c) an oxide layer disposed over the thin light-transmissive layer; and d) a separation layer disposed between the top surface of the thin light-transmissive layer and the oxide layer.

ADVANTAGES

It is an advantage of this invention that a transparent or partially reflecting cathode can be constructed for an OLED device with improved transmissive properties over time. It is a further advantage that this cathode can be used in OLED devices comprising a microcavity structure.

Since device feature dimensions such as layer thicknesses are frequently in sub-micrometer ranges, the drawings are scaled for ease of visualization rather than dimensional accuracy.

DETAILED DESCRIPTION OF THE INVENTION

The term "pixel" is employed in its art recognized usage to designate an area of a display panel that can be stimulated to emit light independently of other areas. The term "OLED device" or "organic light-emitting display" is used in its art recognized meaning of a display device comprising organic light-emitting diodes as pixels. A color OLED device emits light of at least one color. The term "multicolor" is employed to describe a display panel that is capable of emitting light of a different hue in different areas. In particular, it is employed to describe a display panel that is capable of displaying images of different colors. These areas are not necessarily contiguous. The term "full color" is employed to describe multicolor display panels that are capable of emitting in the red, green, and blue regions of the visible spectrum and displaying images in any combination of hues. The red, green, and blue colors constitute the three primary colors from which all other colors can be generated by appropriate mixing. The term "hue" refers to the intensity profile of light emission within the visible spectrum, with different hues exhibiting visually discernible differences in color. The pixel is generally used to designate the smallest addressable unit in a display panel.

Figure 1:
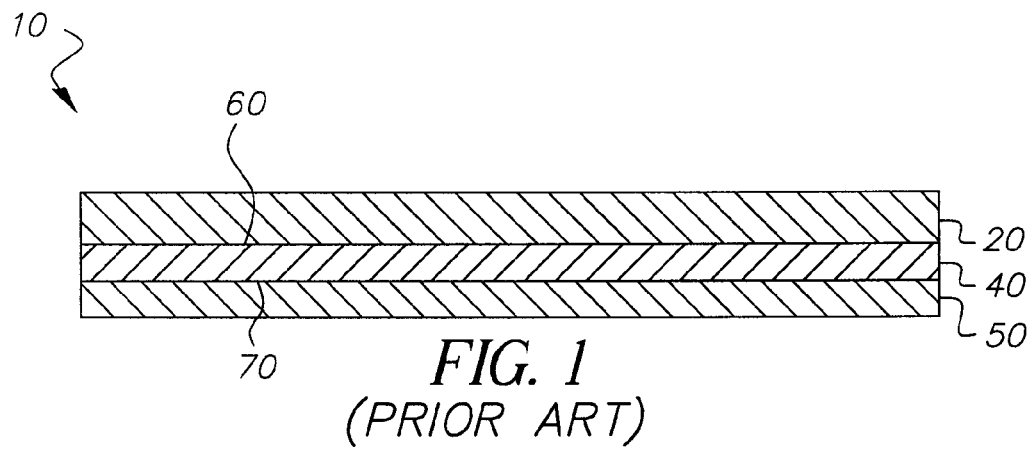
FIG. 1 shows a cross-sectional view of a prior art cathode structure for use in an OLED device.

Turning now to FIG. 1, there is shown a cross-sectional view of a prior art cathode structure for use in a top-emitting organic light-emitting diode (OLED) device. A cathode structure is herein defined as a structure of two or more layers that collectively function as a cathode. A cathode structure in a top-emitting OLED device should be transparent or nearly transparent. Cathode structure 10 comprises oxide layer 20, light-transmissive layer 40, and electron-injecting layer 50, and is positioned over the top of an OLED device. Desirable cathode structure materials have good film-forming properties to ensure good contact with the underlying organic layer, promote electron injection at low voltage, and have good stability. Useful cathode materials often contain a low work function metal (<4.0 eV) or metal alloy. Optically transparent cathodes have been described in more detail in U.S. Pat. Nos. 5,776,623 and 6,548,956.

Light-transmissive layer 40 is a conductive layer that performs the cathode function, or a part of the cathode function, and is also transparent or semitransparent to light of the desired range of wavelengths from an OLED device. While a number of materials can be used, a particularly useful material has been found to be silver (Ag) or alloys thereof, due to its properties of high electrical conductivity and low absorptivity. Light-transmissive layer 40 has top surface 60 and bottom surface 70. The silver in light-transmissive layer 40 acts as a conductor for cathode structure 10. Light-transmissive layer 40 is thin enough that a significant portion of light can pass through it, while at the same time being sufficiently thick to conduct current necessary to operate the OLED device. In practice, thin light-transmissive layer 40 is in the range of 10 to 30 nm and is commonly approximately 13 nm thick. Cathode materials can be deposited by evaporation, sputtering, or chemical vapor deposition. When needed, patterning can be achieved through many well known methods including, but not limited to, through-mask deposition, integral shadow masking as described in U.S. Pat. No. 5,276,380 and EP 0 732 868, laser ablation, and selective chemical vapor deposition. The practice of this invention will be limited to light-transmissive layers 40 comprised of silver or alloys of silver.

Light-transmissive electron-injecting layer 50 is disposed in contact with bottom surface 70 of thin light-transmissive layer 40 and with an underlying OLED layer, which will be further described below. Electron-injecting layer 50 includes a low work function material having a work function less than 4 eV. Such low work function materials include Mg, Ag, Li, LiF/Al, Rb, Cs, Yb, Ba, CaAl, MgAl, Li/Al, or $Li_2O$/Al, or combinations thereof. In one example, electron-injecting layer 50 is comprised of a Mg:Ag alloy wherein the percentage of silver is in the range of 1 to 20%, as described in U.S. Pat. No. 4,885,221. In another example, electron-injecting layer 50 is comprised of a Mg:Al alloy wherein the percentage of magnesium no more than 20%, as described in U.S. Pat. No. 5,059,862. In practice, electron-injecting layer 50 has a thickness in the range of 0.5 to 15 nm and is commonly approximately 6 nm thick.

Electron-injecting layer 50 can include two or more sublayers. In such a case, each sublayer can include a low work function material having a work function less than 4 eV, as described above. For example, electron-injecting layer 50 can comprise a layer of LiF (0.1 to 1.0 nm) in contact with the underlying organic layers, and a silver-magnesium layer as described above. In another example, electron-injecting layer 50 can comprise a layer of LiF as described above, followed by a layer of aluminum from 0.5 to 10 nm thick.

In cathode structure 10, oxide layer 20 is disposed over thin light-transmissive layer 40 in contact with top surface 60 of light-transmissive layer 40. Oxide layer 20 can comprise conductive oxide materials, non-conductive oxide materials, or mixtures of the two. Some examples of oxide layer materials include aluminum oxide, silicon dioxide, silicon oxynitride, indium-tin oxide, indium-zinc oxide, and composite materials such as, for example, zinc sulfide:silicon dioxide. Such materials can form oxide layers by condensing from the vapor phase in deposition processes which include thermal physical vapor deposition, sputter deposition, chemical vapor deposition, plasma-enhanced chemical vapor deposition, laser-induced chemical vapor deposition, induction-assisted chemical vapor deposition, electron-beam-assisted vapor deposition, and atomic layer deposition processes. It can be advantageous to use a conductive oxide in oxide layer 20 as such a conductive oxide material can fill in cracks in light-transmissive layer 40.

It has been found that with the above construction, cathode structure 10 will darken over time and develop a brownish color and the device becomes less efficient. This darkening has been seen to occur upon storage of the display, and even during operation of the display. It is thought that the silver in light-transmissive layer 40 reacts either with the oxide in oxide layer 20 or with oxygen introduced in the formation of oxide layer 20, e.g. by a sputtering process. Such a reaction can form brown silver oxide, which can absorb some of the light emitted by the light-emitting layer or layers of the OLED device, thus leading to a reduction in efficiency and diminishing brightness of the OLED device.

Figure 2:
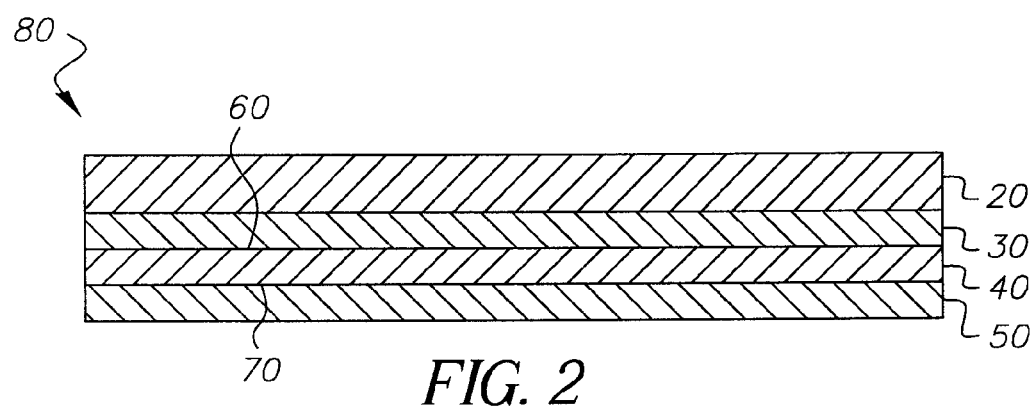
FIG. 2 shows a cross-sectional view of a cathode structure for use in an OLED device in accordance with this invention.

Turning now to FIG. 2, there is shown a cross-sectional view of a cathode structure for use in an OLED device in accordance with this invention. Cathode structure 80 is constructed similarly to cathode structure 10 above, except that separation layer 30 is disposed between top surface 60 of thin light-transmissive layer 40 and oxide layer 20. Separation layer 30 impedes reaction between oxide layer 20 and the silver in light-transmissive layer 40. Separation layer 30 can include metals that do not react with oxygen or that form transparent oxides, such as aluminum (Al), titanium (Ti), lithium (Li) and other Group I metals, magnesium (Mg) and other Group II metals, zinc (Zn), tin (Sn), or indium (In), gold (Au), calcium (Ca), or combinations thereof. A particularly useful metal is aluminum in a thickness range of 1.5 to 10 nm. Separation layer 30 can be a single layer or can include two or more sublayers.

Figure 3:
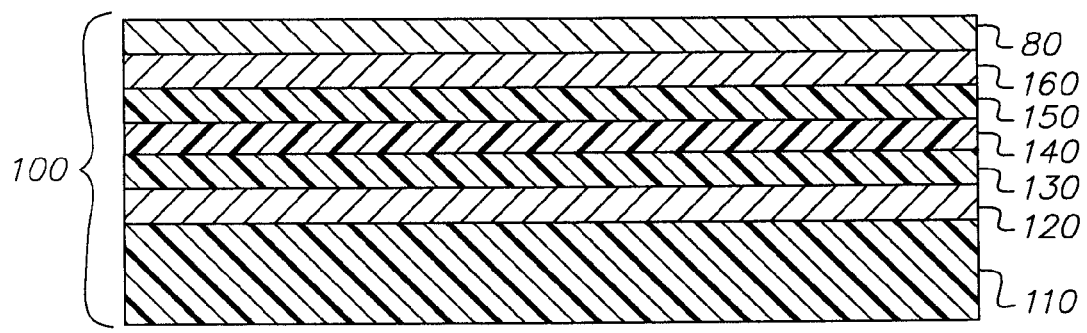
FIG. 3 shows an OLED device incorporating the above cathode structure in accordance with this invention.

Turning now to FIG. 3, there is shown an OLED device incorporating the above cathode structure in accordance with this invention. The OLED device 100 can be a broad-band-emitting OLED device, a white light-emitting OLED device, a single-color-emitting OLED device, or a single pixel of a multicolor OLED device. It includes, at a minimum, a substrate 110, an anode 120, cathode structure 80 as described above and spaced from anode 120, and a light-emitting layer 150. The OLED device 100 can also include a hole-injecting layer 130, a hole-transporting layer 140, an electron-transporting layer 160, and other light-emitting layers. In this particular structure, the underlying OLED layer to light-transmissive electron-injecting layer 50 (as shown in FIGS. 1 and 2) of cathode structure 80 is electron-transporting layer 160. The components of OLED device 100 will be described in more detail.

Substrate 110 can be an organic solid, an inorganic solid, or a combination of organic and inorganic solids. Substrate 110 can be rigid or flexible and can be processed as separate individual pieces, such as sheets or wafers, or as a continuous roll. Typical substrate materials include glass, plastic, metal, ceramic, semiconductor, metal oxide, semiconductor oxide, semiconductor nitride, or combinations thereof. Substrate 110 can be a homogeneous mixture of materials, a composite of materials, or multiple layers of materials. Substrate 110 can be an OLED substrate, that is a substrate commonly used for preparing OLED devices, e.g. active-matrix low-temperature polysilicon or amorphous-silicon TFT substrate. The substrate 110 can be light-transmissive, light absorbing or light reflective. Substrate materials include, but are not limited to, glass, plastic, semiconductor materials, ceramics, and circuit board materials, or any others commonly used in the formation of OLED devices, which can be either passive-matrix devices or active-matrix devices.

An anode 120 is formed over substrate 110. As EL emission is viewed through the top electrode, the transmissive characteristics of the anode material are immaterial and any conductive material can be used, transparent, opaque, or reflective. However, reflective materials can be preferred, especially if the OLED device is a microcavity device. Example conductors for this application include, but are not limited to, gold, iridium, molybdenum, palladium, and platinum. Further examples of anode materials useful in this invention are indium-tin oxide and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, metal selenides such as zinc selenide, and metal sulfides such as zinc sulfide, can be used as an anode material. In some cases a reflective anode is preferred, e.g. in a microcavity structure. The preferred anode materials have a work function of 4.1 eV or greater. Desired anode materials can be deposited by any suitable means such as evaporation, sputtering, chemical vapor deposition, or electrochemical means. Anode materials can be patterned using well known photolithographic processes.

While not always necessary, it is often useful to provide a hole-injecting layer 130. Hole-injecting layer 130 can serve to improve the film formation property of subsequent organic layers and to facilitate hole injection into hole-transporting layer 140. Suitable materials for use in hole-injecting layer 130 include, but are not limited to, porphyrinic compounds as described in U.S. Pat. No. 4,720,432, plasma-deposited fluorocarbon polymers as described in U.S. Pat. Nos. 6,127,004, 6,208,075, and 6,208,077, and some aromatic amines, for example, m-MTDATA (4,4',4"-tris[(3-methylphenyl)phenylamino]triphenyl-amine). Alternative hole-injecting materials for organic EL devices are described in EP 0 891 121 A1 and EP 1 029 909 A1.

Hole-transporting layer 140 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. in U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. Hole-transporting layer 140 can be formed of a single or a mixture of aromatic tertiary amine compounds. Illustrative of useful aromatic tertiary amines are the following:

1,1-Bis(4-di-p-tolylaminophenyl)cyclohexane;
1,1-Bis(4-di-p-tolylaminophenyl)-4-phenylcyclohexane;
4,4'-Bis(diphenylamino)quadriphenyl;
Bis(4-dimethylamino-2-methylphenyl)-phenylmethane;
N,N,N-Tri(p-tolyl)amine;
4-(di-p-tolylamino)-4'-[4(di-p-tolylamino)-styryl]stilbene;
N,N,N',N'-Tetra-p-tolyl-4-4'-diaminobiphenyl;
N,N,N',N'-Tetraphenyl-4,4'-diaminobiphenyl;
N,N,N',N'-tetra-1-naphthyl-4,4'-diaminobiphenyl;
N,N,N',N'-tetra-2-naphthyl-4,4'-diaminobiphenyl;
N-Phenylcarbazole;
4,4'-Bis[N-(1-naphthyl)-N-phenylamino]biphenyl;
4,4'-Bis[N-(1-naphthyl)-N-(2-naphthyl)amino]biphenyl;
4,4"-Bis[N-(1-naphthyl)-N-phenylamino]p-terphenyl;
4,4'-Bis[N-(2-naphthyl)-N-phenylamino]biphenyl;
4,4'-Bis[N-(3-acenaphthenyl)-N-phenylamino]biphenyl;
1,5-Bis[N-(1-naphthyl)-N-phenylamino]naphthalene;
4,4'-Bis[N-(9-anthryl)-N-phenylamino]biphenyl;
4,4"-Bis[N-(1-anthryl)-N-phenylamino]-p-terphenyl;
4,4'-Bis[N-(2-phenanthryl)-N-phenylamino]biphenyl;
4,4'-Bis[N-(8-fluoranthenyl)-N-phenylamino]biphenyl;
4,4'-Bis[N-(2-pyrenyl)-N-phenylamino]biphenyl;
4,4'-Bis[N-(2-naphthacenyl)-N-phenylamino]biphenyl;
4,4'-Bis[N-(2-perylenyl)-N-phenylamino]biphenyl;
4,4'-Bis[N-(1-coronenyl)-N-phenylamino]biphenyl;
2,6-Bis(di-p-tolylamino)naphthalene;
2,6-Bis[di-(1-naphthyl)amino]naphthalene;
2,6-Bis[N-(1-naphthyl)-N-(2-naphthyl)amino]naphthalene;
N,N,N',N'-Tetra(2-naphthyl)-4,4"-diamino-p-terphenyl;
4,4'-Bis{N-phenyl-N-[4-(1-naphthyl)-phenyl]amino}biphenyl;
4,4'-Bis[N-phenyl-N-(2-pyrenyl)amino]biphenyl;
2,6-Bis[N,N-di(2-naphthyl)amine]fluorene;
1,5-Bis[N-(1-naphthyl)-N-phenylamino]naphthalene; and
4,4',4"-tris[(3-methylphenyl)phenylamino]triphenylamine.

Another class of useful hole-transporting materials includes polycyclic aromatic compounds as described in EP 1 009 041. Tertiary aromatic amines with more than two amine groups can be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

As more fully described in U.S. Pat. Nos. 4,769,292 and 5,935,721, light-emitting layer 150 includes a luminescent or fluorescent material where electroluminescence is produced as a result of electron-hole pair recombination in this region, producing light. Light-emitting layer 150 can be comprised of a single material, but more commonly consists of a host material doped with a guest compound or compounds where light emission comes primarily from the dopant and can be of any color. The host materials in light-emitting layer 150 can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes, e.g., poly(p-phenylenevinylene), PPV, can also be used as the host material. In this case, small molecule dopants can be molecularly dispersed into the polymeric host, or the dopant can be added by copolymerizing a minor constituent into the host polymer.

An important relationship for choosing a dye as a dopant is a comparison of the bandgap potential, which is defined as the energy difference between the highest occupied molecular orbital and the lowest unoccupied molecular orbital of the molecule. For efficient energy transfer from the host to the dopant molecule, a necessary condition is that the bandgap of the dopant is smaller than that of the host material. For phosphorescent emitters it is also important that the host triplet energy level be high enough to enable energy transfer from host to dopant.

Host and emitting molecules known to be of use include, but are not limited to, those disclosed in U.S. Pat. Nos. 4,768,292, 5,141,671, 5,150,006, 5,151,629, 5,405,709, 5,484,922, 5,593,788, 5,645,948, 5,683,823, 5,755,999, 5,928,802, 5,935,720, 5,935,721, and 6,020,078.

Metal complexes of 8-hydroxyquinoline (oxine) and similar derivatives constitute one class of useful host compounds capable of supporting electroluminescence. Illustrative of useful chelated oxinoid compounds are the following:

- CO-1: Aluminum trisoxine [alias, tris(8-quinolinolato) aluminum(III)];
- CO-2: Magnesium bisoxine [alias, bis(8-quinolinolato) magnesium(II)];
- CO-3: Bis[benzo{f}-8-quinolinolato]zinc (II);
- CO-4: Bis(2-methyl-8-quinolinolato)aluminum(III)-μ-oxo-bis(2-methyl-8-quinolinolato)aluminum(III);
- CO-5: Indium trisoxine [alias, tris(8-quinolinolato)indium];
- CO-6: Aluminum tris(5-methyloxine) [alias, tris(5-methyl-8-quinolinolato)aluminum(III)];
- CO-7: Lithium oxine [alias, (8-quinolinolato)lithium(I)];
- CO-8: Gallium oxine [alias, tris(8-quinolinolato)gallium (III)]; and
- CO-9: Zirconium oxine [alias, tetra(8-quinolinolato)zirconium(IV)].

Other classes of useful host materials include, but are not limited to, derivatives of anthracene, such as 9,10-di-(2-naphthyl)anthracene, and derivatives thereof as described in U.S. Pat. No. 5,935,721, distyrylarylene derivatives as described in U.S. Pat. No. 5,121,029, and benzazole derivatives, for example, 2,2′,2″-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl) methane compounds, and carbostyryl compounds.

Preferred thin film-forming materials for use in forming electron-transporting layer 160 are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

In some instances, light-emitting layer 150 and electron-transporting layer 160 can optionally be replaced by a single layer that serves the function of supporting both light emission and electron transportation. It is also known in the art that emitting dopants can be added to the hole-transporting layer is 140, which can serve as a host. Additional light-emitting layers can be included. Multiple dopants can be added to one or more layers to emit complementary or nearly complementary colors in order to create a white-emitting OLED, for example, by combining blue- and yellow-emitting materials, cyan- and red-emitting materials, or red-, green-, and blue-emitting materials. White-emitting devices are described, for example, in EP 1 187 235, EP 1 182 244, U.S. Patent Application Publication 2002/0025419 A1, U.S. Pat. Nos. 5,683,823, 5,503,910, 5,405,709, and 5,283,182. As shown in commonly assigned EP 1 187 235, a white-emitting organic EL media can be achieved by the inclusion of the following layers: a hole-injecting layer 130; a hole-transporting layer 140 that is disposed over hole-injecting layer 130 and is doped with a rubrene compound for emitting light in the yellow region of the spectrum; a light-emitting layer 150 doped with a blue light-emitting compound disposed over hole-transporting layer 140; and an electron-transporting layer 160 disposed over light-emitting layer 150. Alternate embodiments where one or more different materials are used in the organic layers for different pixels can also be applied to the present invention.

Additional layers such as electron- or hole-blocking layers as taught in the art can be employed in devices of this invention. Hole-blocking layers are commonly used to improve efficiency of phosphorescent emitter devices, for example, as in U.S. Patent Application Publication 2002/0015859 A1.

The organic materials above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be premixed and coated from a single boat or donor sheet. Patterned deposition can be achieved using shadow masks, integral shadow masks (U.S. Pat. No. 5,294,870), spatially defined thermal dye transfer from a donor sheet (U.S. Pat. Nos. 5,688,551, 5,851,709, and 6,066,357), and inkjet method (U.S. Pat. No. 6,066,357).

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. Nos. 6,226,890 and 6,656,609.

OLED devices of this invention can employ various well known optical effects in order to enhance its properties if desired. This includes, but is not limited to, optimizing layer thicknesses to yield maximum light transmission, providing dielectric mirror structures, replacing reflective electrodes with light-absorbing electrodes, providing anti-glare or anti-reflection coatings over the display, providing a polarizing medium over the display, or providing colored, neutral density, or color conversion filters over the display.

OLED device 100 can comprise a microcavity structure with inclusion of a reflector and a semitransparent reflector, which can be anode 120 and cathode structure 80, or the reflector or semitransparent reflector, or both, can be separate structures. The reflector and semitransparent reflector function, with the layers between them, to form a microcavity, which can be adjusted in thickness and refractive index to resonate at a desired wavelength. Examples of microcavity structures are shown in U.S. Pat. Nos. 6,406,801, 5,780,174, and JP 11288786.

The invention and its advantages can be better appreciated by the following comparative examples.

EXAMPLE 1 (COMPARATIVE)

A comparative OLED device was constructed in the following manner:
1. A clean glass substrate was vacuum-deposited with indium-tin oxide (ITO) to form a transparent electrode of 85 nm thickness;
2. The above prepared ITO surface was treated with a plasma oxygen etch, followed by plasma deposition of a 0.1 nm layer of a fluorocarbon polymer (CFx) as described in U.S. Pat. No. 6,208,075;
3. The above-prepared substrate was further treated by vacuum-depositing a 200 nm layer of 4,4'-bis[N-(1-naphthyl)-N-phenylamino]biphenyl (NPB) as a hole-transporting layer (HTL);
4. A 60 nm electron-transporting layer (ETL) of tris(8-quino-linolato)aluminum (III) (ALQ), which is also an emitting layer, was vacuum-deposited onto the substrate at a coating station that included a heated tantalum boat source;
5. A 0.5 nm layer of lithium fluoride was evaporatively deposited onto the substrate, followed by 3 nm layer of magnesium-silver alloy in a 1:10 ratio to form a light-transmissive electron-injecting layer as a part of a cathode structure;
6. A 13 nm layer of silver was evaporatively deposited onto the device to form a conductive thin light-transmissive layer as part of a cathode structure; and
7. The above device was vacuum-deposited with indium-tin oxide (ITO) to form a transparent cover layer of 75 nm thickness.

EXAMPLE 2 (INVENTIVE)

An OLED device was constructed in the manner described in Example 1, except that the following step was added after step 6:
6a. A 3 nm layer of aluminum was evaporatively deposited onto the device to form a conductive thin light-transmissive separation layer.

RESULTS (EXAMPLES 1-2)

Figure 4:
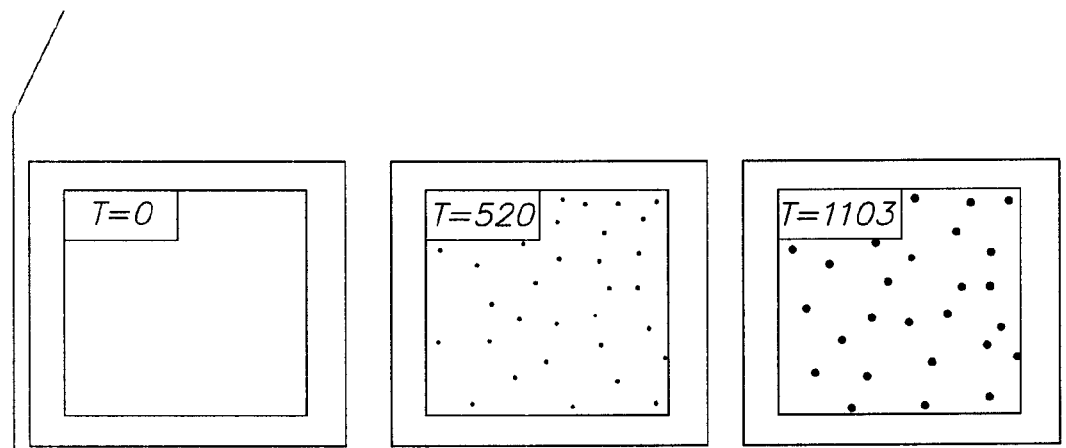
FIG. 4 shows the results of an aging test of a device according to this invention vs. a comparative device.
Figure 4:
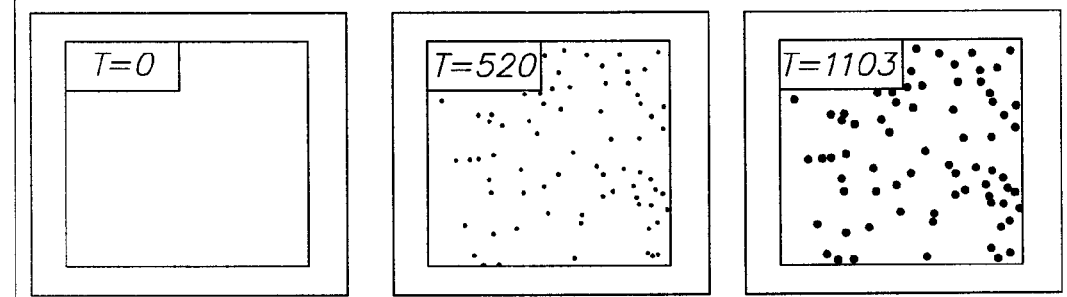

The devices were tested by storing the devices in an environment of 85° C. and 85% relative humidity, and the devices were examined visually for darkening after 520 and 1103 hours. The results are shown in FIG. 4. The results show that the device without a separation layer between the conductive thin light-transmissive silver layer and the overlying indium-tin oxide layer shows significant darkening over the duration of the test. When a thin separation layer of aluminum is placed between the silver and indium-tin oxide layers, the darkening is significantly reduced.

The invention has been described in detail with particular reference to certain preferred embodiments thereof, but it will be understood that variations and modifications can be effected within the spirit and scope of the invention.

| PARTS LIST | |
|---|---|
| 10 | cathode structure |
| 20 | oxide layer |
| 30 | separation layer |
| 40 | light-transmissive layer |
| 50 | electron-injecting layer |
| 60 | top surface |
| 70 | bottom surface |
| 80 | cathode structure |
| 100 | OLED device |
| 110 | substrate |
| 120 | anode |
| 130 | hole-injecting layer |
| 140 | hole-transporting layer |
| 150 | light-emitting layer |
| 160 | electron-transporting layer |

The invention claimed is:

1. A cathode structure for use in an OLED device having one or more OLED layers, comprising:
    a) a thin light-transmissive layer having a top surface and a bottom surface and including silver (Ag) wherein the Ag acts as a conductor for the cathode structure;
    b) a light-transmissive electron-injecting layer disposed in contact with the bottom surface of the thin light-transmissive layer and with an underlying OLED layer;
    c) an oxide layer disposed over the thin light-transmissive layer; and
    d) a separation layer disposed between the top surface of the thin light-transmissive layer and the oxide layer for impeding reaction between the oxide layer and the silver in the light transmissive layer.

2. The cathode structure of claim 1 wherein the electron-injecting layer includes two or more sublayers.

3. The cathode structure of claim 2 wherein the two or more sublayers of the electron-injecting layer each include a low work function material having a work function less than 4 eV.

4. The cathode structure of claim 3 wherein the low work function material includes Mg, Ag, Li, LiF/Al, Rb, Cs, Yb, Ba, CaAl, MgAl, Li/Al, or Li$_2$O/Al, or combinations thereof.

5. The cathode structure of claim 1 wherein the electron-injecting layer is a single layer having a low work function material having a work function less than 4 eV.

6. The cathode structure of claim 5 wherein the low work function material includes Mg, Ag, Li, LiF/Al, Rb, Cs, Yb, Ba, CaAl, MgAl, Li/Al, or Li$_2$O/Al, or combinations thereof.

7. A cathode structure for use in an OLED device having one or more OLED layers, comprising:
    a) a thin light-transmissive layer having a top surface and a bottom surface and including Ag wherein the Ag acts as a conductor for the cathode structure;
    b) a light-transmissive electron-injecting layer disposed in contact with the bottom surface of the thin light-transmissive layer and with an underlying OLED layer;
    c) an oxide layer disposed over the thin light-transmissive layer and
    d) a separation layer including Al, Ti, Mg, Zn, Sn, In, Au, Li, or Ca, or combinations thereof disposed between the top surface of the thin light-transmissive layer and the oxide layer for impeding reaction between the oxide layer and the silver in the light transmissive layer.

8. The cathode structure of claim 7 wherein the electron-injecting layer includes two or more sublayers.

9. The cathode structure of claim 8 wherein the two or more sublayers of the electron-injecting layer each include a low work function material having a work function less than 4 eV.

10. The cathode structure of claim 9 wherein the low work function material includes Mg, Ag, Li, LiF/Al, Rb, Cs, Yb, Ba, CaAl, MgAl, Li/Al, or $Li_2O$/Al, or combinations thereof.

11. The cathode structure of claim 7 wherein the electron-injecting layer is a single layer having a low work function material having a work function less than 4 eV.

12. The cathode structure of claim 11 wherein the low work function material includes Mg, Ag, Li, LiF/Al, Rb, Cs, Yb, Ba, CaAl, MgAl, Li/Al, or $Li_2O$/Al, or combinations thereof.

* * * * *